US010312120B2

(12) United States Patent
Ravid et al.

(10) Patent No.: US 10,312,120 B2
(45) Date of Patent: Jun. 4, 2019

(54) POSITION AND TEMPERATURE MONITORING OF ALD PLATEN SUSCEPTOR

(71) Applicant: Applied Materials, Inc., Santa Clara, CA (US)

(72) Inventors: Abraham Ravid, San Jose, CA (US); Kevin Griffin, Livermore, CA (US); Joseph Yudovsky, Campbell, CA (US); Kaushal Gangakhedkar, San Jose, CA (US); Dmitry A. Dzilno, Sunnyvale, CA (US); Alex Minkovich, Campbell, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/774,377

(22) PCT Filed: Mar. 14, 2014

(86) PCT No.: PCT/US2014/028988
§ 371 (c)(1),
(2) Date: Sep. 10, 2015

(87) PCT Pub. No.: WO2014/144533
PCT Pub. Date: Sep. 18, 2014

(65) Prior Publication Data
US 2016/0027675 A1    Jan. 28, 2016

Related U.S. Application Data

(60) Provisional application No. 61/791,850, filed on Mar. 15, 2013.

(51) Int. Cl.
*H01L 21/67* (2006.01)
*C23C 16/44* (2006.01)
(Continued)

(52) U.S. Cl.
CPC .... *H01L 21/67259* (2013.01); *C23C 16/4584* (2013.01); *C23C 16/45544* (2013.01);
(Continued)

(58) Field of Classification Search
CPC ............... C23C 16/52; C23C 16/4585; H01L 21/67259–21/67265; H01L 21/68764; H01L 21/681; H01L 21/67248
(Continued)

(56) References Cited

U.S. PATENT DOCUMENTS

2003/0183611 A1    10/2003    Gregor et al.
2004/0158347 A1*    8/2004    Sha .................. H01L 21/67259
                                                                 700/218
(Continued)

FOREIGN PATENT DOCUMENTS

JP      2008-300394         12/2008
JP      2011224653 A    *   11/2011
WO      WO-2012-166313      12/2012

OTHER PUBLICATIONS

PCT International Preliminary Report on Patentability in PCT/US2014/028988, dated Sep. 24, 2015, 12 Pages.
(Continued)

*Primary Examiner* — Charlee J C Bennett
(74) *Attorney, Agent, or Firm* — Servilla Whitney LLC (57) ABSTRACT

Apparatus and methods of measuring and controlling the gap between a susceptor assembly and a gas distribution assembly are described. Apparatus and methods for positional control and temperature control for wafer transfer purposes are also described.

18 Claims, 6 Drawing Sheets

(51) Int. Cl.
  *H01L 21/687* (2006.01)
  *C23C 16/52* (2006.01)
  *C23C 16/455* (2006.01)
  *C23C 16/458* (2006.01)
(52) U.S. Cl.
  CPC ........ *C23C 16/52* (2013.01); *H01L 21/67248* (2013.01); *H01L 21/68764* (2013.01); *H01L 21/68771* (2013.01)
(58) Field of Classification Search
  USPC ............... 700/100–199; 156/345.13, 345.15, 156/345.24–345.27
  See application file for complete search history.

(56) References Cited

U.S. PATENT DOCUMENTS

| | | | | |
|---|---|---|---|---|
| 2005/0036673 A1* | 2/2005 | Ohba | ..................... | G01C 11/06 382/154 |
| 2006/0086321 A1* | 4/2006 | Brody | ................... | C23C 14/042 118/720 |
| 2006/0150903 A1* | 7/2006 | Zuger | ................... | B05B 12/084 118/663 |
| 2008/0308743 A1* | 12/2008 | Mizuochi | ................ | H01J 37/20 250/440.11 |
| 2009/0180722 A1* | 7/2009 | Dougherty | ............ | B60B 27/001 384/448 |
| 2010/0055312 A1 | 3/2010 | Kato et al. | | |
| 2010/0112194 A1* | 5/2010 | Inoue | ..................... | C23C 14/042 427/66 |
| 2010/0124610 A1* | 5/2010 | Aikawa | ............... | C23C 16/4584 427/255.28 |
| 2010/0259768 A1* | 10/2010 | Frissen | ..................... | G01D 5/28 356/614 |
| 2011/0232569 A1* | 9/2011 | Olgado | .................. | C23C 16/54 118/719 |
| 2012/0292305 A1* | 11/2012 | Ambal | ............. | H01L 21/67103 219/520 |
| 2013/0196454 A1* | 8/2013 | Inoue | ..................... | C23C 14/042 438/5 |
| 2015/0377714 A1* | 12/2015 | Fujii | ...................... | G01N 25/00 374/187 |

OTHER PUBLICATIONS

PCT International Search Report and Written Opinion in PCT/US2014/028988, dated Aug. 25, 2014, 15 pages.

* cited by examiner

POSITION AND TEMPERATURE MONITORING OF ALD PLATEN SUSCEPTOR

CROSS-REFERENCE TO RELATED APPLICATIONS

This is the National Phase entry of International Patent Application No. PCT/US14/28988, filed Mar. 14, 2014, which claims priority to U.S. Provisional Application No. 61/791,850, filed Mar. 15, 2013, the disclosures of which are incorporated herein by reference in their entireties.

BACKGROUND

Embodiments of the present invention generally relate to an apparatus for processing substrates. More particularly, the invention relates to a batch processing platform for performing atomic layer deposition (ALD) and chemical vapor deposition (CVD) on substrates.

The process of forming semiconductor devices is commonly conducted in substrate processing platforms containing multiple chambers. In some instances, the purpose of a multi-chamber processing platform or cluster tool is to perform two or more processes on a substrate sequentially in a controlled environment. In other instances, however, a multiple chamber processing platform may only perform a single processing step on substrates; the additional chambers are intended to maximize the rate at which substrates are processed by the platform. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for ALD processes and some chemical vapor deposition (CVD) processes.

The effectiveness of a substrate processing platform, or system, is often quantified by cost of ownership (COO). The COO, while influenced by many factors, is largely affected by the system footprint, i.e., the total floor space required to operate the system in a fabrication plant, and system throughput, i.e., the number of substrates processed per hour. Footprint typically includes access areas adjacent the system that are required for maintenance. Hence, although a substrate processing platform may be relatively small, if it requires access from all sides for operation and maintenance, the system's effective footprint may still be prohibitively large.

The semiconductor industry's tolerance for process variability continues to decrease as the size of semiconductor devices shrink. To meet these tighter process requirements, the industry has developed a host of new processes which meet the tighter process window requirements, but these processes often take a longer time to complete. For example, for forming a copper diffusion barrier layer conformally onto the surface of a high aspect ratio, 65 nm or smaller interconnect feature, it may be necessary to use an ALD process. ALD is a variant of CVD that demonstrates superior step coverage compared to CVD. ALD is based upon atomic layer epitaxy (ALE) that was originally employed to fabricate electroluminescent displays. ALD employs chemisorption to deposit a saturated monolayer of reactive precursor molecules on a substrate surface. This is achieved by cyclically alternating the pulsing of appropriate reactive precursors into a deposition chamber. Each injection of a reactive precursor is typically separated by an inert gas purge to provide a new atomic layer to previous deposited layers to form an uniform material layer on the surface of a substrate. Cycles of reactive precursor and inert purge gases are repeated to form the material layer to a desired thickness. The biggest drawback with ALD techniques is that the deposition rate is much lower than typical CVD techniques by at least an order of magnitude. For example, some ALD processes can require a chamber processing time from about 10 to about 200 minutes to deposit a high quality layer on the surface of the substrate. In choosing such ALD and epitaxy processes for better device performance, the cost to fabricate devices in a conventional single substrate processing chamber would increase due to very low substrate processing throughput. Hence, when implementing such processes, a continuous substrate processing approach is needed to be economically feasible.

New generations of ALD process tools require a tight control of the gap between the wafer and the deposition source (injector) to meet composition and thickness uniformity across the wafer and between wafers. The process may take place in a wide range of temperatures, and in a range of separation between the wafer and the deposition source. It can be important to monitor the uniformity of the distance across the wafers area, which can be as large as 1.5 m in diameter. Also, the temperature range that the system works at requires adjustments for thermal expansion to meet the accuracy of wafer placement in the process pockets.

Therefore, there is a need in the art for apparatus and methods providing control over the injector to gap distance over long diameters and temperature ranges.

SUMMARY

Embodiments of the invention are directed to deposition apparatus comprising a gas distribution assembly, a susceptor assembly and a camera. The gas distribution assembly has a front surface and an edge. The susceptor assembly is spaced from the gas distribution assembly to rotate a plurality of substrates around a central axis. The susceptor assembly has a top surface with a plurality of recesses to hold a plurality of substrates, a bottom surface and an edge. The top surface of the susceptor assembly and the front surface of the gas distribution assembly define a gap. The camera has a field of view including the edge of the susceptor assembly. A controller is connected to the camera to determine the gap between the top surface of the susceptor assembly and the front surface of the gas distribution assembly.

In some embodiments, there are at least three cameras spaced about an interior region of the deposition apparatus. Each camera has a field of view including the edge of the susceptor assembly and each camera is connected to the controller.

In one or more embodiments, the controller determines the gap between the top surface of the susceptor assembly and one or more of the front surface of the gas distribution assembly or a reference plane at each camera position while the susceptor assembly remains stationary.

In some embodiments, the field of view of the camera further includes the edge of the gas distribution assembly and the gap. In one or more embodiments, there are at least three cameras spaced about an interior region of the deposition apparatus, each camera having a field of view including the edge of the susceptor assembly, the edge of the gas distribution plate and the gap, each camera connected to the controller. In some embodiments, the controller determines a plane formed by the susceptor assembly relative to a plane formed by the gas distribution assembly.

In one or more embodiments, the gas distribution assembly comprises a reference mark on the edge of the gas distribution plate, the reference mark being used as a substitute for the front surface of the gas distribution plate when determining the gap.

In some embodiments, there is one camera and the controller uses a plurality of images from the camera taken during a processing cycle in which the susceptor assembly rotates, the controller determining the planarity of the susceptor assembly from measurements from the plurality of images taken during the processing cycle.

In one or more embodiments, the controller includes a feedback circuit in communication with at least one gap control actuation device, the controller providing a signal to the at least one gap control actuation device to direct the device to move one or more of the susceptor assembly and the gas distribution assembly to change the gap.

Additional embodiments of the invention are directed to deposition apparatus comprising a gas distribution assembly and a susceptor assembly. The gas distribution assembly has a front surface and an edge. The susceptor assembly is spaced from the gas distribution assembly to rotate a plurality of substrates around a central axis. The susceptor assembly has a top surface with a plurality of recesses to hold a plurality of substrates, a bottom surface and an edge, wherein the top surface of the susceptor assembly and the front surface of the gas distribution assembly define a gap. A plurality of capacitance sensors are positioned on the front surface of the gas distribution assembly directed toward the top surface of the susceptor assembly. Each of the capacitance sensors provides an electrical signal which is proportional to the distance of the top surface of the susceptor assembly to the capacitance sensor. A controller is connected to the plurality of capacitance sensors to determine the gap between the top surface of the susceptor assembly and the front surface of the gas distribution assembly from the electrical signals provided by the plurality of capacitance sensors.

In some embodiments, the controller includes a memory to store calibrated values of the electrical signals provided by the plurality of capacitance sensors as a function of the gap as one or more of a lookup table or standardization equation.

In one or more embodiments, the controller determines the gap between the top surface of the susceptor assembly and the front surface of the gas distribution assembly at each capacitance sensor position while the susceptor assembly remains stationary. In some embodiments, the controller creates a three-dimensional map of the top surface of the susceptor assembly from the electrical signals provided by the plurality of capacitance sensors.

In one or more embodiments, the controller uses a plurality of measurements from at least one capacitance sensor taken during a processing cycle in which the susceptor assembly rotates, the controller determining the planarity of a portion of the susceptor assembly adjacent the capacitance sensor from the electrical signals provided by the capacitance sensor during the processing cycle.

In some embodiments, the controller includes a feedback circuit in communication with at least one gap control actuation device, the controller providing a signal to the at least one gap control actuation device to direct the device to move one or more of the susceptor assembly and the gas distribution assembly to change the gap.

Further embodiments of the invention are directed to deposition apparatus comprising a susceptor assembly, a controller and a camera. The susceptor assembly is to rotate a plurality of substrates around a central axis. The susceptor assembly has a top surface and a bottom surface. The surface has a plurality of recesses to hold a plurality of substrates and each recess has a center. The bottom surface has an alignment reference point for at least one of the plurality of recesses. The camera has a field of view directed at the bottom surface of the susceptor assembly and positioned so that when a recess is positioned adjacent a loading station, the alignment reference point is within the field of view of the camera. The controller is connected to the camera to determine the position of the recess adjacent the loading station from the alignment reference point.

In some embodiments, the alignment reference point comprises a recess center reference point and a camera reference point, the recess center reference point providing an indication of the position of the center of the recess and the camera reference point providing an indication of the camera alignment relative to the recess center reference point to correct for marking misalignment. In one or more embodiments, the recess center reference point comprises a hole in the bottom surface of the susceptor assembly.

In some embodiments, the camera reference point comprises a shape made up of at two vertices having known distances between each vertex. In one or more embodiments, the camera reference point comprises a rectangular shape.

In some embodiments, the controller includes a memory to store calibrated values of each alignment reference point, the controller determining the position of the recess by comparing the alignment reference point to the stored calibrated values. In one or more embodiments, the controller is in communication with the susceptor assembly to send signals to rotate the susceptor assembly based on the determination of the position of the recess. In some embodiments, the controller is in communication with a transfer robot to provide a signal to the robot indicating the location of the recess so that the robot can place a substrate in the recess in a consistent position.

In one or more embodiments, the bottom surface of the susceptor assembly further comprises a temperature reference point within the field of view of the camera and the determines the temperature of the susceptor assembly from the position of the temperature reference point.

In some embodiments, the temperature reference point comprises a groove in the bottom surface of the susceptor assembly at a fixed diameter.

In one or more embodiments, the temperature reference point and the alignment reference point are within the field of view at the same time and the controller determines the position of the recess compensating for the temperature of the susceptor assembly.

Additional embodiments of the invention are directed to methods of measuring a gap between a rotatable susceptor assembly and a gas distribution assembly in a processing chamber. At least one camera is positioned adjacent the susceptor assembly and gas distribution assembly so that an edge of the susceptor assembly, and optionally, an edge of the gas distribution assembly and the gap are visible in a field of view of the camera. An image of the field of view of the camera is taken. The image including the edge of the susceptor assembly and, optionally, the edge of the gas distribution assembly and the gap. The position on the image of a top surface of the susceptor assembly is determined and, optionally, a front surface of the gas distribution assembly.

The gap between the top surface of the susceptor assembly and the front surface of the gas distribution assembly is determined from the image.

In some embodiments, there are three cameras positioned around the susceptor assembly and gas distribution assembly and the gap is measured for each camera. One or more embodiments, further comprise determining an angle of tilt of the susceptor assembly relative to the gas distribution plate.

In one or more embodiments, measuring the gap comprises one or more of measuring the distance between the top surface of the susceptor assembly and the front surface of the gas distribution assembly or measuring the distance between the top surface of the susceptor assembly and a reference plane.

In some embodiments, a single camera is used and the method further comprising rotating the susceptor assembly about a central axis; taking in image of the field of view of the camera at known rotational angles relative to the susceptor assembly to generate a plurality of images; determining the gap for each of the plurality of images; and determining the uniformity of the gap as a function of the susceptor assembly rotational angle.

One or more embodiments of the invention are directed to methods of measuring a gap between a rotatable susceptor assembly and a gas distribution assembly in a processing chamber. At least one sensor is positioned on the gas distribution assembly facing the susceptor assembly, the sensor being one or more of a capacitance sensor and an eddy current sensor. An electrical signal from the at least one sensor is measured. The electrical signal is proportional to the gap between the susceptor assembly and the sensor. The gap between the susceptor assembly and the gas distribution assembly is determined from the electrical signal.

In some embodiments, a plurality of sensors are positioned on the gas distribution assembly, and the electrical signal from each sensor is measured, and the method further comprising determining the gap between the susceptor assembly and each sensor, and generating the three-dimensional map of the susceptor assembly.

In one or more embodiments, a single susceptor is monitored, the method further comprising: rotating the susceptor assembly about a central axis; measuring a plurality of electrical signals from the susceptor as a function of susceptor assembly rotational angle or time; determining the gap for each of the plurality of electrical signals; and determining the uniformity of the gap as a function of the susceptor assembly rotational angle or time.

Additional embodiments of the invention are directed to methods of transferring a substrate to a rotatable susceptor assembly. The susceptor assembly is rotated so that a recess in a top surface of the susceptor assembly is positioned adjacent a loading area of a processing chamber. An alignment reference point on a back side of the susceptor assembly is found using a camera directed at the back side of the susceptor assembly. The position of the recess on the top surface of the susceptor assembly is determined by measuring the position of the alignment reference point on the back side of the susceptor assembly to determine coordinates of the recess. The coordinates of the recess are communicated to one or more of a controller and a transfer robot to allow the transfer robot to place the substrate within the recess reproducibly.

In some embodiments, the alignment reference point comprises a recess center reference point and a camera reference point, the recess center reference point providing an indication of the position of the center of the recess and the camera reference point providing an indication of the camera alignment relative to the camera reference point, evaluating the position of the recess further comprising correcting for the alignment of the camera.

In one or more embodiments, the controller includes a memory to store calibrated values of each alignment reference point, the controller determining the position of the recess by comparing the alignment reference point to the stored calibrated values and adjusting the rotational position of the susceptor assembly to improve the alignment of the recess with the loading area.

Some embodiments further comprise finding a temperature reference point on the bottom of the susceptor using a camera and measuring a temperature of the susceptor assembly from a position of the temperature reference point. In one or more embodiments, the temperature reference point comprises a groove in the bottom surface of the susceptor assembly at a fixed diameter.

In some embodiments, the temperature reference point and the alignment reference point are within a field of view of the camera at the same time and the coordinates of the recess are determined compensating for the temperature of the susceptor assembly. In one or more embodiments, the temperature reference point is the alignment reference point.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention are directed to apparatus and methods for measuring the gap between the injector assembly and substrate or susceptor assembly. Some embodiments of the invention are directed to apparatus and methods for placing a wafer on a susceptor assembly in a reproducible manner. One or more embodiments of the invention are directed to apparatus and methods for measuring the temperature of a susceptor assembly. Some embodiments of the invention provide static and dynamic 3D mapping of the gap across the plating area, as well as direct temperature measurement and on the fly adjustment of wafer placement coordinates using cameras, capacitance sensors and design elements to enable monitoring various parameters.

As used in this specification and the appended claims, the terms "wafer", "substrate" and the like are used interchangeably. In some embodiments, the wafer is a rigid, discrete substrate.

In some embodiments, a rotating susceptor is assumed to be a rigid body with vertical actuators placed at the outer diameter of the susceptor. The actuators apply pressure against a bearing which pushes the susceptor against the injectors above. Each injector has reference pads with an opposing bearing. As the pressure is applied to actuators the gap closes against the injector pads until a predetermined force is reached correlating to a gap distance In some embodiments, the susceptor is not a rigid body, so actuators with a bearing are placed at the outer diameter and inner diameter of the susceptor. The injectors assembly has reference pads with an opposing bearing at both the inner diameter and outer diameter. As the pressure is applied to the actuators, the gap closes against the injector pads until a predetermined force is reached correlating to a gap distance.

Figure 1:
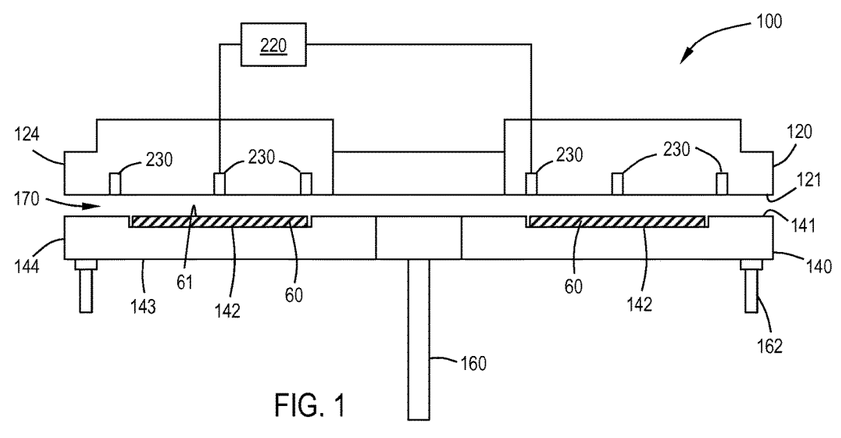
FIG. 1 is a cross-sectional side view of a processing chamber in accordance with one or more embodiment of the invention.

FIG. 1 shows cross-section of a processing chamber 100 including a gas distribution assembly 120, also referred to as injectors or an injector assembly, and a susceptor assembly 140. The gas distribution assembly 120 is any type of gas delivery device used in a processing chamber. The gas distribution assembly 120 includes a front surface 121 which faces the susceptor assembly 140. The front surface 121 can have any number or variety of openings to deliver a flow of gases toward the susceptor assembly 140. The gas distribution assembly 120 also includes an outer edge 124 which, in the embodiments, shown, is substantially round.

The specific type of gas distribution assembly 120 used can vary depending on the particular process being used. Embodiments of the invention can be used with any type of processing system where the gap between the susceptor and the gas distribution assembly is controlled. While various types of gas distribution assemblies can be employed (e.g., showerheads), embodiments of the invention may be particularly useful with spatial ALD gas distribution assemblies which have a plurality of substantially parallel gas channels. As used in this specification and the appended claims, the term "substantially parallel" means that the elongate axis of the gas channels extend in the same general direction. There can be slight imperfections in the parallelism of the gas channels. The plurality of substantially parallel gas channels can include at least one first reactive gas A channel, at least one second reactive gas B channel, at least one purge gas P channel and/or at least one vacuum V channel. The gases flowing from the first reactive gas A channel(s), the second reactive gas B channel(s) and the purge gas P channel(s) are directed toward the top surface of the wafer. Some of the gas flow moves horizontally across the surface of the wafer and out of the processing region through the purge gas P channel(s). A substrate moving from one end of the gas distribution assembly to the other end will be exposed to each of the process gases in turn, thereby forming a layer on the substrate surface.

Figure 2:
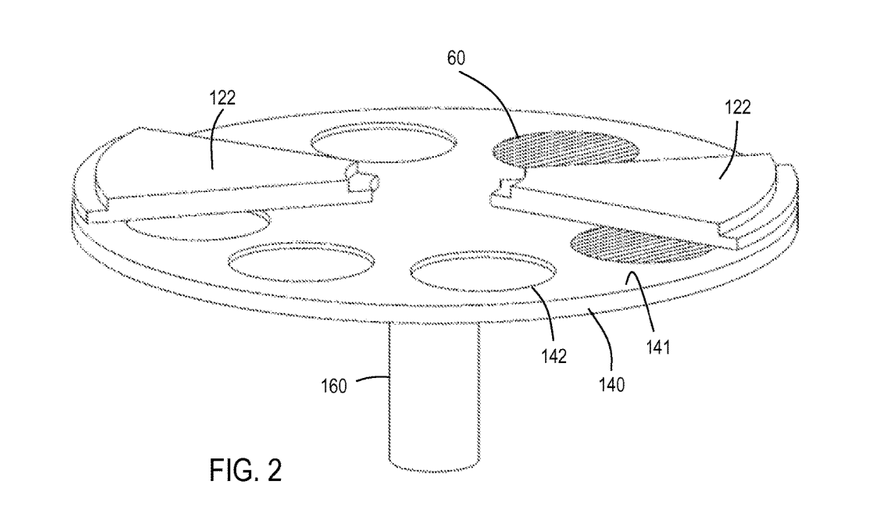
FIG. 2 shows a perspective view of a processing chamber with pie-shaped gas distribution sectors in accordance with one or more embodiments of the invention.

In some embodiments, the gas distribution assembly 120 is a rigid stationary body made of a single injector unit. In one or more embodiments, the gas distribution assembly 120 is made up of a plurality of individual sectors 122, as shown in FIG. 2. Either a single piece body or a multi-sector body can be used with the various embodiments of the invention described.

The susceptor assembly 140 is positioned beneath the gas distribution assembly 120. The susceptor assembly 140 includes a top surface 141 and at least one recess 142 in the top surface 141. The susceptor assembly 140 also has a bottom surface 143 and an edge 144 The recess 142 can be any suitable shape and size depending on the shape and size of the wafers 60 being processed. In the embodiment shown in FIG. 1, the recess 142 has a flat bottom to support the bottom of the wafer, but it will be understood that the bottom of the recess can vary. In some embodiments, the recess has step regions around the outer peripheral edge of the recess which are sized to support the outer peripheral edge of the wafer. The amount of the outer peripheral edge of the wafer that is supported by the steps can vary depending on, for example, the thickness of the wafer and the presence of features already present on the back side of the wafer.

In some embodiments, as shown in FIG. 1, the recess 142 in the top surface 141 of the susceptor assembly 140 is sized so that a wafer 60 supported in the recess 142 has a top surface 61 substantially coplanar with the top surface 141 of the susceptor 140. As used in this specification and the appended claims, the term "substantially coplanar" means that the top surface of the wafer and the top surface of the susceptor assembly are coplanar within ±0.2 mm. In some embodiments, the top surfaces are coplanar within ±0.15 mm, ±0.10 mm or ±0.05 mm.

The susceptor assembly 140 of FIG. 1 includes a support post 160 which is capable of lifting, lowering and rotating the susceptor assembly 140. The susceptor assembly may include a heater, or gas lines, or electrical components within the center of the support post 160. The support post 160 may be the primary means of increasing or decreasing the gap between the susceptor assembly 160 and the gas distribution assembly 120, moving the susceptor assembly 140 into proper position. The susceptor assembly 140 may also include fine tuning actuators 162 which can make micro-adjustments to susceptor assembly 140 to create a desired gap 170 between the susceptor assembly 140 and the gas injector assembly 120.

In some embodiments, the gap 170 distance is in the range of about 0.1 mm to about 5.0 mm, or in the range of about 0.1 mm to about 3.0 mm, or in the range of about 0.1 mm to about 2.0 mm, or in the range of about 0.2 mm to about 1.8 mm, or in the range of about 0.3 mm to about 1.7 mm, or in the range of about 0.4 mm to about 1.6 mm, or in the range of about 0.5 mm to about 1.5 mm, or in the range of about 0.6 mm to about 1.4 mm, or in the range of about 0.7 mm to about 1.3 mm, or in the range of about 0.8 mm to about 1.2 mm, or in the range of about 0.9 mm to about 1.1 mm, or about 1 mm.

The processing chamber 100 shown in the Figures is a carousel-type chamber in which the susceptor assembly 140 can hold a plurality of wafers 60. As shown in FIG. 2, the gas distribution assembly 120 may include a plurality of separate injector units 122, each injector unit 122 being capable of depositing a film on the wafer, as the wafer is moved beneath the injector unit. Two pie-shaped injector units 122 are shown positioned on approximately opposite sides of and above the susceptor assembly 140. This number of injector units 122 is shown for illustrative purposes only. It will be understood that more or less injector units 122 can be included. In some embodiments, there are a sufficient number of pie-shaped injector units 122 to form a shape conforming to the shape of the susceptor assembly 140. In some embodiments, each of the individual pie-shaped injector units 122 may be independently moved, removed and/or replaced without affecting any of the other injector units 122. For example, one segment may be raised to permit a robot to access the region between the susceptor assembly 140 and gas distribution assembly 120 to load/unload wafers 60.

Figure 4:
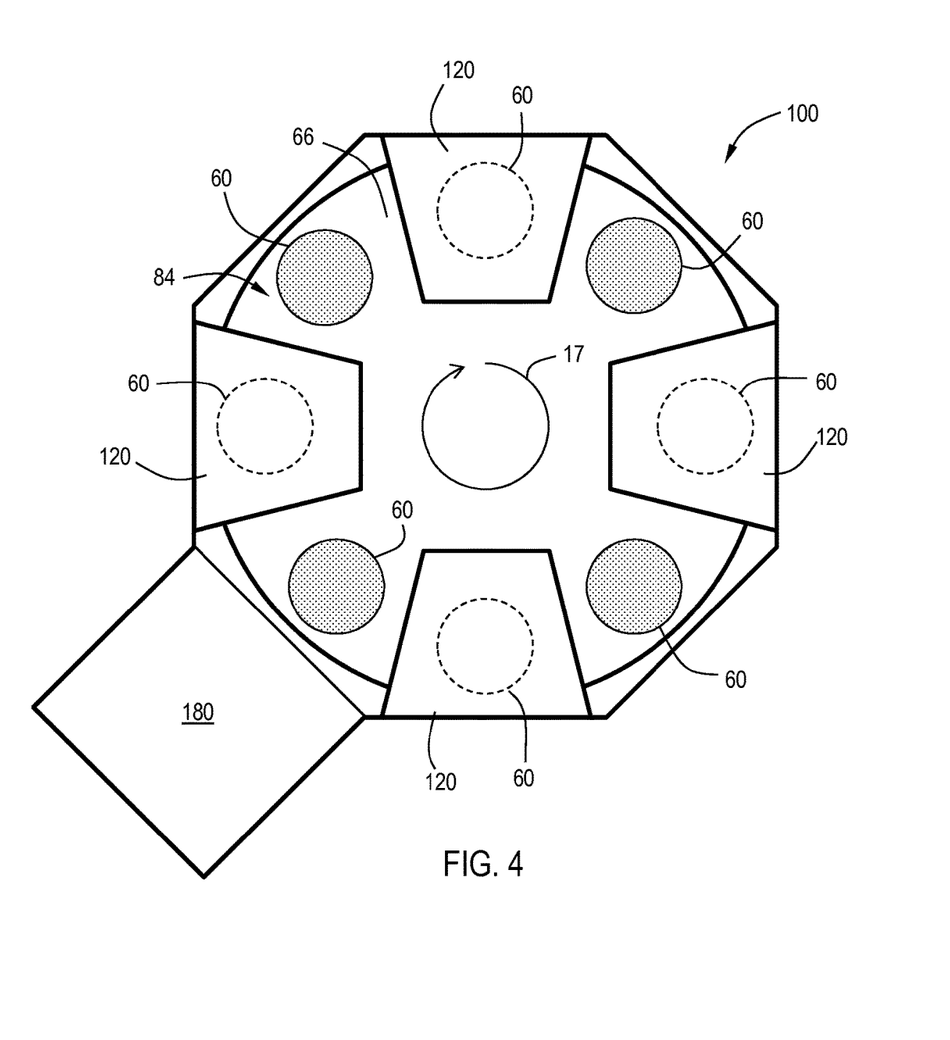
FIG. 4 is a schematic plan view of a substrate processing system configured with four gas distribution assemblies and a loading station in accordance with one or more embodiments of the invention.

Processing chambers having multiple gas injectors can be used to process multiple wafers simultaneously so that the wafers experience the same process flow. For example, as shown in FIG. 4, the processing chamber 100 has four gas injector assemblies 120 and four wafers 60. At the outset of processing, the wafers 60 can be positioned between the injector assemblies 30. Rotating 17 the susceptor assembly 140 by 45° will result in each wafer 60 which is between injector assemblies 120 to be moved to an injector assembly 120 for film deposition, as illustrated by the dotted circle under the injector assemblies 120. An additional 45° rotation would move the wafers 60 away from the injector assemblies 30. With spatial ALD injectors, a film is deposited on the wafer during movement of the wafer relative to the injector assembly. In some embodiments, the susceptor assembly 140 is rotated in increments that prevent the wafers 60 from stop beneath the injector assemblies 120. The number of wafers 60 and gas distribution assemblies 120 can be the same or different. In some embodiments, there are the same number of wafers being processed as there are gas distribution assemblies. In one or more embodiments, the number of wafers being processed are fraction of or an integer multiple of the number of gas distribution assemblies. For example, if there are four gas distribution assemblies, there are 4× wafers being processed, where x is an integer value greater than or equal to one.

The processing chamber 100 shown in FIG. 4 is merely representative of one possible configuration and should not be taken as limiting the scope of the invention. Here, the processing chamber 100 includes a plurality of gas distribution assemblies 120. In the embodiment shown, there are four gas distribution assemblies 30 evenly spaced about the processing chamber 100. The processing chamber 100 shown is octagonal, however, it will be understood by those skilled in the art that this is one possible shape and should not be taken as limiting the scope of the invention. The gas distribution assemblies 120 shown are trapezoidal, but it will be understood by those skilled in the art that the gas distribution assemblies can be a single circular component or made up of a plurality of pie-shaped segments, like that shown in FIG. 2.

The embodiment shown in FIG. 4 includes a load lock chamber 180, or an auxiliary chamber like a buffer station. This chamber 180 is connected to a side of the processing chamber 100 to allow, for example the substrates 60 to be loaded/unloaded from the chamber 100. A wafer robot may be positioned in the chamber 180 to move the substrate Rotation of the carousel (e.g., the susceptor assembly 140) can be continuous or discontinuous. In continuous processing, the wafers are constantly rotating so that they are exposed to each of the injectors in turn. In discontinuous processing, the wafers can be moved to the injector region and stopped, and then to the region 84 between the injectors and stopped. For example, the carousel can rotate so that the wafers move from an inter-injector region across the injector (or stop adjacent the injector) and on to the next inter-injector region where it can pause again. Pausing between the injectors may provide time for additional processing steps between each layer deposition (e.g., exposure to plasma).

Figure 3:
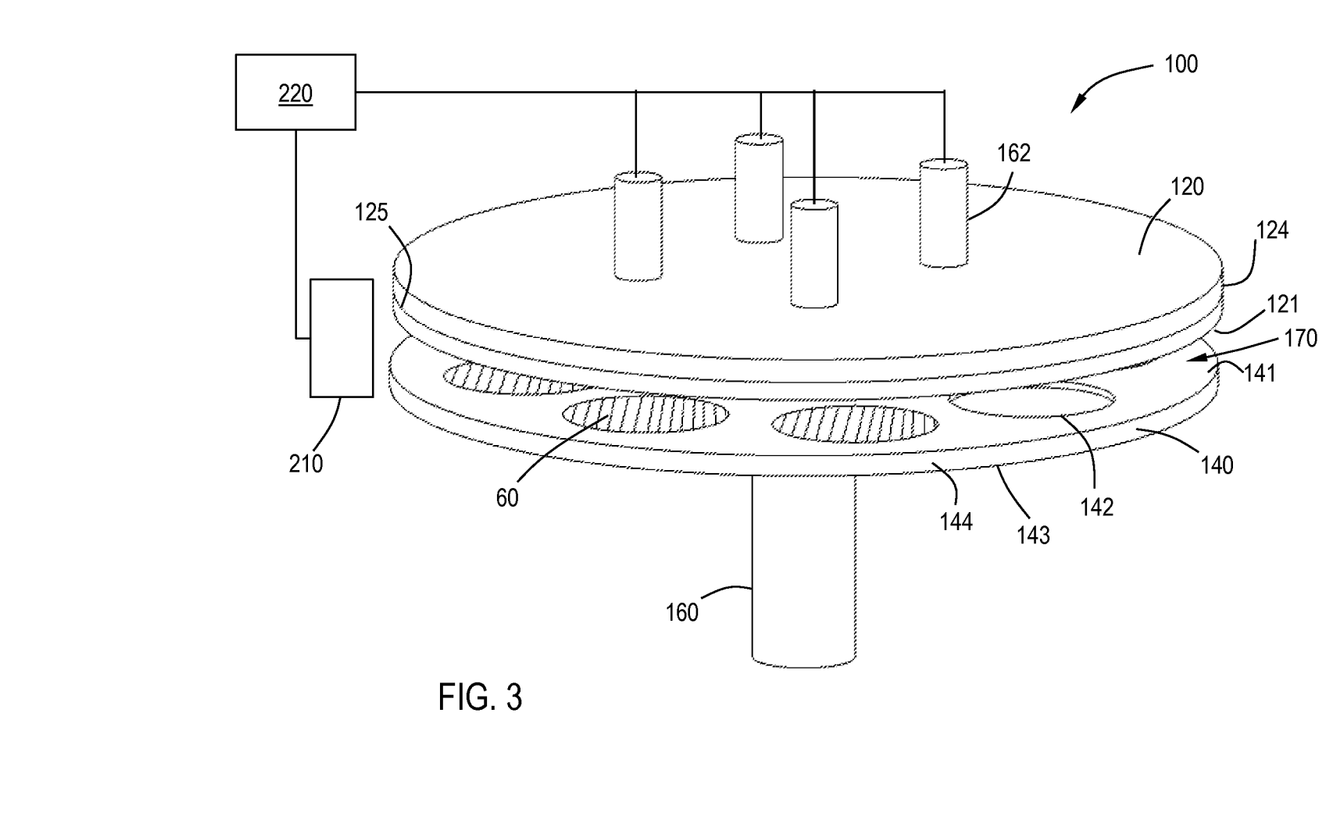
FIG. 3 shows a perspective view of a processing chamber in accordance with one or more embodiments of the invention.

One or more embodiments of the invention can be used for gap 170 control. Referring to FIG. 3, gap 170 control can be achieved by using externally mounted CCD cameras 210 for image capture and processing, and/or capacitance sensors 230 (shown in FIG. 1) embedded inside the gas distribution assembly 120 or the plating platform (i.e., the susceptor assembly 140) for real time and continuous gap 170 measurement. As used in this specification and the appended claims, the term "image" refers to a two-dimensional array of data points obtained by an optical instrument, for example, a digital photograph that provides an actual visual representation of the subject matter being focused upon or within the field of view. In some embodiments, the entire image is captured in a single snapshot in time as opposed to a sequential or random series of measurements over the same physical space. An image may be an uninterrupted two-dimensional representation of the three-dimensional subject matter.

The cameras 210 can be mounted in, for example, three positions around the susceptor assembly 140, with a field of view wide enough to simultaneously capture the edges of the gas injector plate and the susceptor that carries the wafer, face up against the gas flow from the injector. This allows the injector to perform as a reference point to measuring the gap. Using three cameras, a single image of both with a stationary susceptor allows the determination of the plane formed by the carrier relative to the injector. This is useful to monitor tilt and offsets of the plating surface, and to enable adjustments and calibration of this gap. Measuring the position of the plating edge as the carrier rotates, allows for monitoring of dynamic gap non uniformity, as an example caused by wobbling during the rotation or non-uniform sagging of the carrier platform. The edges of the plates might be identified using image processing techniques to provide a 2D map of the static and dynamic dimension uniformity.

Accordingly, with reference to FIG. 3, one or more embodiments of the invention are directed to deposition apparatus 100. The apparatus includes a gas distribution assembly 120 which has a front surface 121 and an edge 124. For ease of description, the gas distribution assembly 120 is shown as a disc-shaped unit, but those skilled in the art will understand that this can be a very irregular shape, especially on the top portion where gas lines may be connected.

The apparatus 100 also includes a susceptor assembly 140 which is spaced from the gas distribution assembly 120. The susceptor assembly has a top surface 141, a bottom surface 143 and an edge 144. The space is referred to as the gap 170 and is the primary reactive region of the apparatus. The susceptor assembly 140 has support post 160 acting as a central axis about which the susceptor assembly 140 can rotate. The susceptor assembly 140 has a top surface 141 with a plurality of recesses 142, also referred to as pockets, sized to hold a plurality of substrates.

A camera 210 is positioned near the edges of the susceptor assembly and gas distribution assembly and has a field of view including the edge 124 of the gas distribution assembly 120, the edge 144 of the susceptor assembly 140 and the gap 170. While only a single camera 210 is shown in FIG. 3, it will be understood that more than one camera 210 can also be employed. For example, since a minimum of three points are needed to define a plane, some embodiments of the invention use three cameras which, when analyzed can provide sufficient data to calculate a plane.

In some embodiments, the camera 210 has a field of view that includes the edge 144 of the susceptor assembly 140. In embodiments of this sort, the camera 210 may be calibrated to a reference plane other than the gas distribution assembly 120. For example, the camera 210 may be calibrated to some reference plane not in the image (e.g., such as a mechanical standard plane). The gap can be calculated from the location of the susceptor edge 144 in relation to the standard plane.

The camera 210 is connected to a controller 220. The controller can be a computer with a memory for storing information and support circuits for analyzing data and communication with external devices, like the camera 210 or actuators 162. The controller evaluates the image from the camera 210 to determine the gap 170 between the top surface 141 of the susceptor assembly 140 and the front surface 121 of the gas distribution assembly 120.

The camera 210 generates an image which can be analyzed by the controller 220. During analysis, the controller 220 might detect the front edge of the gas distribution assembly, which correlates to the front surface 121 of the gas distribution assembly 120, and the top edge of the susceptor assembly 140, which correlates to the top surface of the 141 of the susceptor assembly 140. When the camera 210 is at a known distance from the gas distribution assembly 120, the number of pixels between the front edge of the gas distribution assembly and the top edge of the susceptor assembly are proportional to the size of the gap 170. The camera 210 may include a lens that can show the gap over a number of pixels. Meaning that the lens has sufficient resolution to show gap. The controller may count the number of pixels between the edges and compare the value to a look-up table for the given distance to the gas distribution assembly 120. While a look-up table technique is described, those skilled in the art will understand that there are other techniques for correlating the camera 210 image to the gap 170 size (e.g., a standardization equation).

Figure 5:
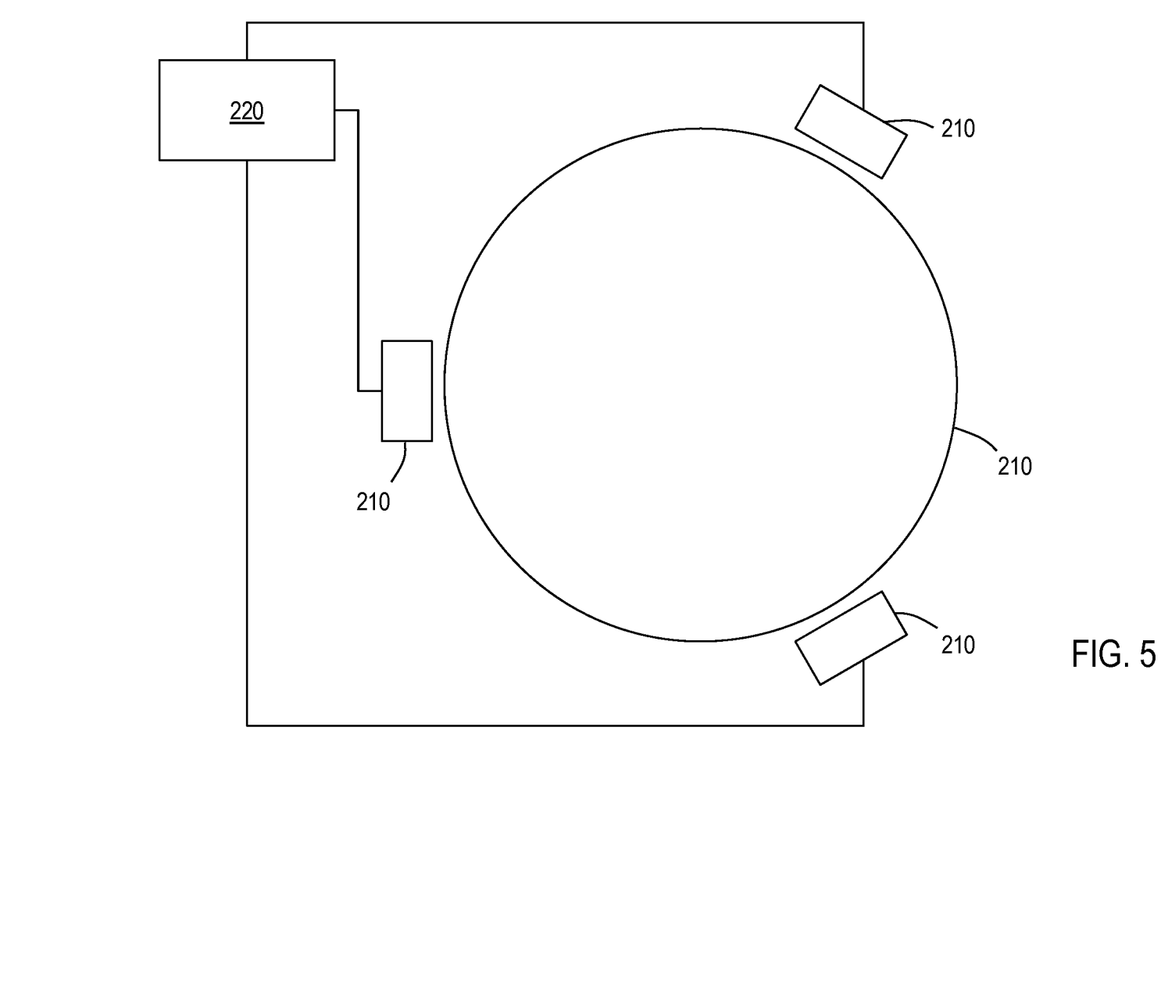
FIG. 5 is a schematic plan view of a processing system in accordance with one or more embodiments of the invention.

Referring to FIG. 5, in some embodiments, there are at least three cameras 210 spaced about an interior region of the deposition apparatus 100. The embodiment shown in FIG. 5 is a top view showing top of the gas distribution assembly 120 with the susceptor assembly 140 positioned below the plane of the page. For ease of visualization, gas lines and connections to the gas distribution assembly 120 are omitted from this drawing, but it will be understood that there can be any number of gas connections or vacuum connections to the gas distribution assembly. The spacing can vary, for example, each camera 210 may be 120° apart around the circular gas distribution assembly 120 and susceptor assembly 140. Each camera 210 can see the edge 124 of the gas distribution assembly 120, the edge 144 of the susceptor assembly 140 and the gap 170 simultaneously. The image taken from each camera 210 can be processed by the controller 220 and the gap 170 at each camera 210 location can be determined. The controller can determine the plane formed by the susceptor assembly 140 relative to a plane formed by the gas distribution assembly 120. This would allow for the tilt angle, relative to a fixed gas distribution assembly 120, to be calculated. For example, if the gap 170 measured by each of the cameras 210 were identical; there would be substantially no tilt between the susceptor assembly 140 and the gas distribution assembly 120, meaning that the two would be coplanar. Analyzing only the edge of the susceptor cannot guarantee that the entire susceptor is completely flat, so this component would be substantially coplanar, with small regions, possibly, that are not perfectly coplanar.

Multi-camera analysis of the gap may be particularly useful when the susceptor assembly 140 is stationary. The controller can analyze the gap and then send signals to the support post 160 or actuators 162, shown on the bottom in FIG. 1 and on the top in FIG. 3, which can change the size of the gap 170. The controller 210 may include a feedback circuit in communication with at least one gap control actuation device (e.g., the support post 160 or actuators 162). The controller 220 can provide a signal to the at least one gap control actuation device to direct the device to move one or more of the susceptor assembly 140 and the gas distribution assembly 120 to change the size of the gap 170.

In addition to analyzing the stationary susceptor to injector gap 170, the controller can analyze the planarity of the susceptor assembly 140 dynamically. A single camera 210 can be used to record a plurality of images of the gap as the susceptor assembly 140 rotates. The images can be time stamped or correlated to the specific rotational angle of the susceptor assembly 140. Analyzing the gap 170 as a function of the angle or time, the controller can calculate the planarity of the susceptor assembly 140. While only one camera is needed for dynamic measurements of the planarity, multiple cameras can be used as well.

In some embodiments, the gas distribution assembly 120 comprises a reference mark 125 on the edge 124 of the gas distribution assembly 120. The reference mark 125 can be used as a substitute for the front surface 121 of the gas distribution assembly 120 in calculating the gap 170. The reference mark, shown in FIG. 1, can be, for example, a groove etched into the edge 124 of the gas distribution assembly 120 at a known distance from the front surface 121 of the gas distribution assembly 120. The image captured by the camera would include the reference line 125, which may be easier to detect by the controller 220 instead of determining the edge of the gas distribution assembly 120. A similar reference mark can be created on the edge 144 of the susceptor assembly 140 and used in the same fashion. In some embodiments, the controller 220 analyzes an image from the camera 210 in which both reference marks are visible. The spacing between the reference marks, less then distance of the reference marks from the edges of the respective assemblies, would result in the size of the gap 170.

In some embodiments, mounting sensors 230 (e.g., capacitance sensors or eddy current sensors) in a fixed injector plate may enable real time 3D mapping of the gap or the surface of the susceptor assembly 140. This may be performed when the wafer carrier plate is stationary, or rotating under the injector assembly. The capacitance sensor heads face the wafer carrier surface, and transmit an electrical signal that is proportional to the distance of the carrier surface from the sensor. Mounting several sensors in different places across the plating area allows for static and dynamic 3D mapping of the separation between the wafer and the gas sources.

A plurality of capacitance sensors 230 can be positioned on the front surface 121 of the gas distribution assembly 120 directed toward the top surface 141 of the susceptor assembly 140. If the capacitance sensors 230 are not perfectly flush with the surface of the gas distribution assembly, then the offset amount can be included in any calculations. The controller 220 can be connected to the plurality of capacitance sensors 230 to determine the gap 170 between the top surface 141 of the susceptor assembly 140 and the front surface 121 of the gas distribution assembly 120 from the electrical signals provided by the plurality of capacitance sensors 230.

In some embodiments, the controller 220 determines the gap 170 between the top surface 141 of the susceptor assembly 140 and the front surface 121 of the gas distribution assembly 120 at each capacitance sensor 230 position while the susceptor assembly 140 remains stationary. With enough sensors 230 placed about the surface of the gas distribution assembly, a detailed 3D mapping of the surface of the susceptor could be obtained.

In one or more embodiments, the controller 220 uses a plurality of measurements from at least one capacitance sensor 230 taken during a processing cycle in which the susceptor assembly 140 rotates. The controller 220 can determine the planarity of a portion of the susceptor assembly 140 adjacent the capacitance sensor 230 from the electrical signals provided by the capacitance sensor 230 during the processing cycle. Analysis of this sort across different portions of the susceptor assembly 140 can provide a detailed map of the planarity of the susceptor assembly as a function of the distance to the edge of the susceptor assembly by determining the planarity of concentric portions of the assembly.

Again, the controller 220 may include one or more feedback circuits in communication with at least one gap control actuation device. With the detailed analysis of the planarity of the susceptor assembly 140, the controller 220 might provide a signal to one or more actuator to move just a portion of the susceptor assembly 140 closer to or further from the injector assembly. This may be particularly useful where the susceptor assembly 140 is made up of a plurality of pie-shaped segments, like the injector assembly of FIG. 2.

Embodiments of the invention can also be used for position control for wafer transfer and detection of the temperature of the susceptor assembly. When a wafer is going to be placed in a susceptor recess 142, the recess 142 must be near the transfer robot and in a known position. Referring to FIG. 4, the susceptor assembly 140 can be rotated until one of the recesses 142 is adjacent the transfer station 180. The robot may pick up a wafer and deposit a new wafer into the recess before rotating the susceptor assembly again.

Placing a camera 210 looking at the back surface 143 of the wafer carrier plate (i.e., susceptor assembly 140), and preparing a known feature in the plate that can be detected by the camera 210, allows for accurate angular and radial determination of the target location to place the wafer at. The camera must have a wide enough field of view to cover all possible movement range around the nominal target position, and resolution power for accurate determination of the target position for the wafer transfer operation. Image processing algorithms act to analyze the picture and determine the point in X-Y plane for the wafer to be placed at or picked up from.

Additionally, monitoring the position of a known feature carved in the lower surface of the wafer carrier, allows for accurate and absolute determination of the susceptor bulk-temperature, through the measurement of the amount of thermal expansion. This feature may be a groove placed in a fixed diameter around the plate. This allows for real time continuous monitoring across the wafer carrier plate as it rotates, or static measurement when the carrier is not moving, such as when wafer transfer is taking place.

An advantage of this technique, as opposed to, for example, pyrometers, is that it is independent of the surface properties, and coating will not affect the temperature reading accuracy. Since it is reasonable to assume that the thermal regiment is in steady state, this measurement provides a very good correlation to the steady state wafer temperature during the plating process.

Figure 6A:
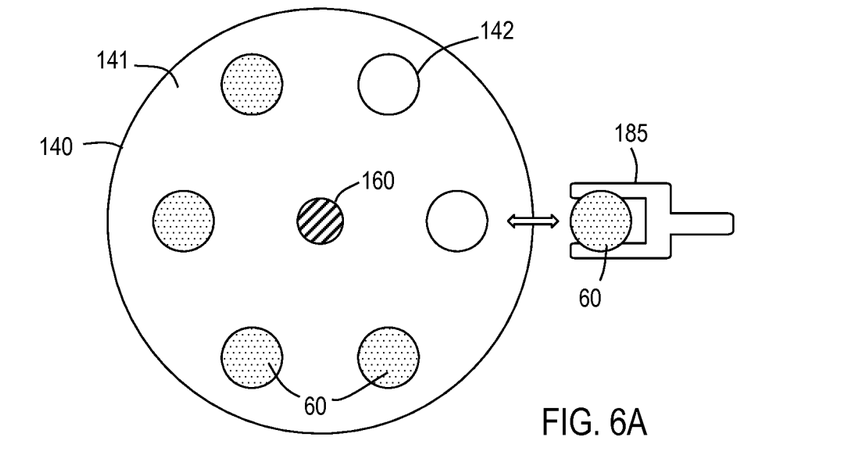
FIG. 6A shows schematic view of the top surface of a susceptor assembly and a transfer robot in accordance with one or more embodiments of the invention.
Figure 6B:
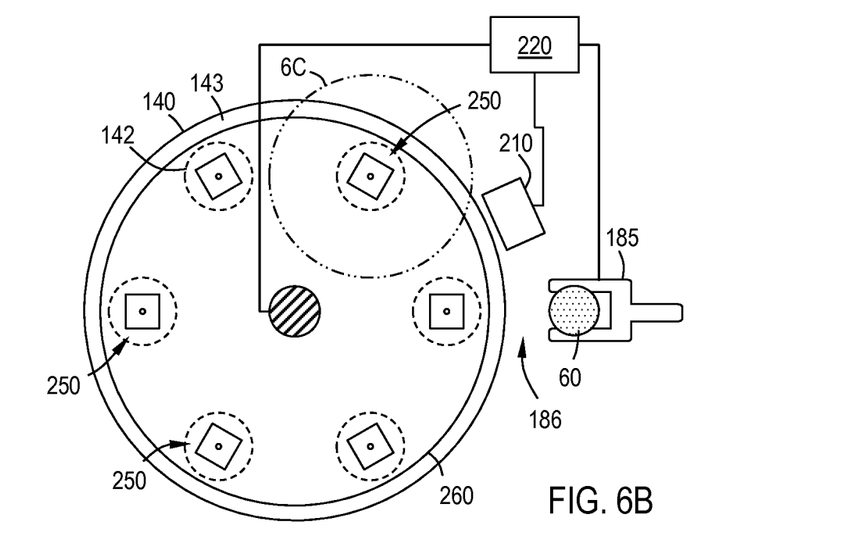
FIG. 6B shows a schematic view of the bottom surface of the susceptor assembly of FIG. 6A.
Figure 6C:
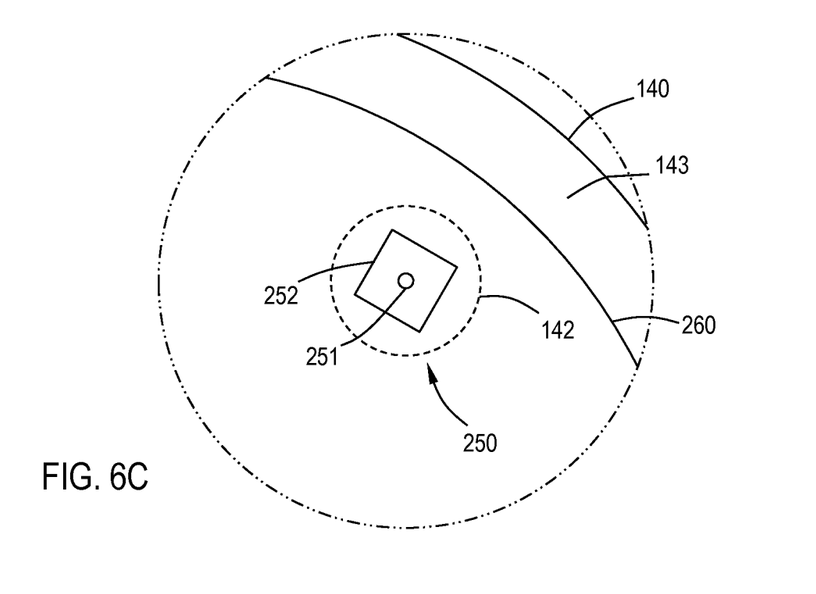
FIG. 6C shows an expanded view of a portion of FIG. 6B.

Referring to FIGS. 6A through 6C, one or more embodiments of the invention are directed to apparatus which can accurately determine the position of the susceptor assembly 140 recesses 142. FIG. 6A shows a view of a susceptor assembly 140 looking at a top surface 141 thereof. The susceptor assembly 140 shown has six recesses 142 with each being empty. A transfer robot 185 is shown moving a substrate 60 to the susceptor assembly 140 to be placed in the recess 142 located in the loading area 186. The loading area 186 is a loose term to describe the area between and including the susceptor assembly 140 portion near the robot 185 (this portion will change as the susceptor assembly rotates), the recess 142, a camera 210 and the robot 185. Embodiments of the invention help the transfer robot 185 accurately place the substrate 60 in the recess 142.

FIG. 6B shows the bottom surface 143 of the susceptor assembly 140 of FIG. 6A. The recesses 142 in the top surface 141 are shown in phantom but are not visible from this side. Here it can be seen that the susceptor assembly 140 has a plurality of alignment reference points 250. FIG. 6C shows an expanded view of one of the alignment reference points 250 in a phantom recess 142.

The alignment reference point 250 is made up of two separate components, a camera recess center reference point 251 and a camera reference point 252. The combination of these two points 251, 252 make up the total alignment reference point 250. The alignment reference point 250 shown is made of a circle inside a rectangle. Each of these reference points can be used for different purposes. In some embodiments, there is one alignment reference point 250 for each recess 142 in the top surface 141.

A camera 210 is positioned in the loading area 186 below the susceptor assembly 140 so that the camera 210 looks at the bottom surface 143 of the susceptor assembly 140. The camera 210 shown in FIG. 6B is off to the side of the susceptor assembly 140 only for ease of drawing, it is actually below the recess in the loading area 186 and would block the view of the alignment reference point. The camera 210 has a field of view directed at the bottom surface 143 of the susceptor assembly 140 and is positioned so that when a recess 142 is positioned adjacent a loading station 186, the alignment reference point 250 opposite the recess 142 is within the field of view of the camera 210. Therefore, the camera 210 is looking up at the susceptor assembly and viewing the alignment reference point 250. The camera is in communication with a controller 220 to determine the position of the recess adjacent the loading station from the alignment reference point.

The components of the alignment reference point 250 can be used separately or together. In the circle in square example shown in FIG. 6C, both the recess center reference point 251 and camera reference point 252 are in the field of view. The field of view must be large enough to see the reference point 250 at any location within the loading region 186. The recess center reference point 251 is a central point for the distance calculation and does not need to be exactly opposite the center of the recess. The recess center reference point 251 provides a measure, for example, of the shortest distance between the recess center reference point 251 and the edge of the susceptor assembly 140. This is merely illustrative and other measures could be used.

Since the susceptor assembly 140 rotates, the recess center reference point 251 may not be in the exact center of the field of view of the camera 210. The camera reference point 252 is used to determine where in the susceptor path of travel that the alignment point is located. For example, as the susceptor rotates, the center point moves across the field of view but the camera reference point 252 will move and rotate slightly as it moves because it is a shaped object, not merely a point. The camera reference point 252 may be used to correct for angular shifts of the camera mount, thermal distortion, or any other distortions that may cause the center of the pocket to shift.

Figure 7A:
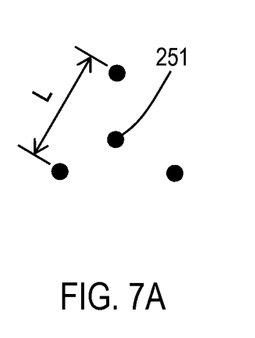
FIGS. 7A-7C show examples of alignment reference points in accordance with one or more embodiments of the invention.
Figure 7B:
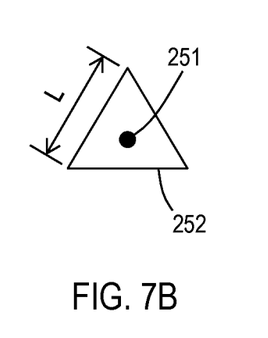
Figure 7C:
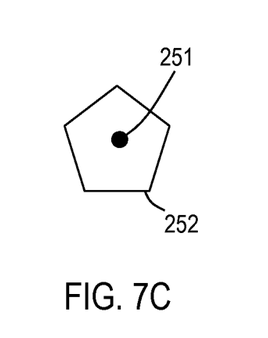

The camera reference point 252 can be any shape involving at least two vertices. In fact, the camera reference point 252 does not need to be an actual shape as long as two vertices are observed. Examples of possible camera reference points 252 are shown in FIGS. 7A through 7C. FIG. 7A shows a center reference point 251 surrounded by three points which, if connected with lines, would make a triangle. The controller can recognize the pattern and location of the points to determine the center and orientation of the reference. FIG. 7B shows a similar reference point in which there is a triangle formed in the bottom surface of the susceptor assembly. FIG. 7C shows a pentagonal camera reference point 252 that could also be used. The alignment reference point 250 may be used to accurately determine the pixel scape of the camera at any temperature.

The distance L between the points can be a standardized or known value. The distance measured by the controller with the pattern recognition of the alignment reference point 250 can then be used to determine the distance of the camera 210 from the bottom surface 143 of the susceptor assembly 140. As the camera 210 moves farther from the bottom surface 141 of the susceptor assembly, the images in the field of view of the camera will appear smaller, and will encompass a smaller number of pixels in the image. From this information and using, for example, a look-up table or standardization equation, the distance of the camera 210 from the susceptor assembly 140 can be determined and, if needed, incorporated into the position calculation.

In some embodiments, the recess center reference point 251 comprises a hole in the bottom surface 143 of the susceptor assembly 140. The hold can be shallow (i.e., less than about 25% of the thickness of the material), deep (i.e., greater than 25% of the thickness of the material) or a through hole. In one or more embodiments, the camera reference point comprises a shape made up of at least two vertices having known distances between each vertex. In some embodiments, the camera reference point comprises one or more of a triangle, a square, a pentagon, a hexagon, a plurality of points, or other shapes.

The controller 220 can be in communication with the camera 210 and one or more of the transfer robot 185 and the susceptor assembly 140 support post 160. With a feedback circuit, the controller 220 can provide a signal to one or both of the robot 185 and the support post 160 to make necessary adjustments. If the recess 142 is in view and close to the robot 185, the instructions provided to the robot may include the precise coordinates for the robot to place the wafer so that it fits properly in the recess. If, for example, the recess 142 is too far for the robot to reach, the controller can send signals to the support post to rotate the susceptor assembly to improve the location.

The temperature of the susceptor assembly 140 can also be determined. In some embodiments, the bottom surface 143 of the susceptor assembly 140 further comprises a temperature reference point 260 within the field of view of the camera 210. As used in this specification and the appended claims, the term "reference point" is not limited to a dot or circle, but can also be a shape or line, as long as it is recognizable by the controller. The temperature reference point 260 can be used by the controller 220 to determine the temperature of the susceptor assembly 140 from the position of the temperature reference point 260. For example, as shown in FIGS. 6B and 6C, the temperature reference point 260 is a groove in the bottom surface 143 of the susceptor assembly 140. The groove is at a fixed diameter, or a known radial position relative to the central axis, edge of the susceptor assembly and/or the alignment reference point 250. As the temperature increases, the susceptor assembly will change shape causing a difference in the distance between the temperature reference point 260 and a known reference. The controller 220 can evaluate the distance between these points and using, for example, a look-up table, determine the temperature associated with that distance.

Follows is a list of various embodiments but it will be understood that there are other embodiments and combinations of embodiments that are within the scope as well.

1. Embodiment 1 is directed to a deposition apparatus comprising:
   a gas distribution assembly having a front surface and an edge;
   a susceptor assembly spaced from the gas distribution assembly to rotate a plurality of substrates around a central axis, the susceptor assembly having a top surface with a plurality of recesses to hold a plurality of substrates, a bottom surface and an edge, wherein the top surface of the susceptor assembly and the front surface of the gas distribution assembly defining a gap;
   a camera having a field of view including the edge of the susceptor assembly; and
   a controller connected to the camera to determine the gap between the top surface of the susceptor assembly and the front surface of the gas distribution assembly.
2. The apparatus of embodiment 1, wherein there are at least three cameras spaced about an interior region of the deposition apparatus, each camera having a field of view including the edge of the susceptor assembly, each camera connected to the controller.
3. The apparatus of embodiment 2, wherein the controller determines the gap between the top surface of the susceptor assembly and one or more of the front surface of the gas distribution assembly or a reference plane at each camera position while the susceptor assembly remains stationary.
4. The apparatus of embodiment 1, wherein the field of view of the camera further includes the edge of the gas distribution assembly and the gap.
5. The apparatus of embodiment 4, wherein there are at least three cameras spaced about an interior region of the deposition apparatus, each camera having a field of view including the edge of the susceptor assembly, the edge of the gas distribution plate and the gap, each camera connected to the controller.
6. The apparatus of embodiment 5, wherein the controller determines a plane formed by the susceptor assembly relative to a plane formed by the gas distribution assembly.
7. The apparatus of embodiment 1 to 6, wherein the gas distribution assembly comprises a reference mark on the edge of the gas distribution plate, the reference mark being used as a substitute for the front surface of the gas distribution plate when determining the gap.
8. The apparatus of embodiment 1 to 7, wherein there is one camera and the controller uses a plurality of images from the camera taken during a processing cycle in which the susceptor assembly rotates, the controller determining the planarity of the susceptor assembly from measurements from the plurality of images taken during the processing cycle.
9. The apparatus of embodiment 1 to 8, wherein the controller includes a feedback circuit in communication with at least one gap control actuation device, the controller providing a signal to the at least one gap control actuation device to direct the device to move one or more of the susceptor assembly and the gas distribution assembly to change the gap.
10. Embodiment 10 is directed to a deposition apparatus comprising:
 a gas distribution assembly having a front surface and an edge;
 a susceptor assembly spaced from the gas distribution assembly to rotate a plurality of substrates around a central axis, the susceptor assembly having a top surface with a plurality of recesses to hold a plurality of substrates, a bottom surface and an edge, wherein the top surface of the susceptor assembly and the front surface of the gas distribution assembly define a gap;
 a plurality of capacitance sensors positioned on the front surface of the gas distribution assembly directed toward the top surface of the susceptor assembly, each of the capacitance sensors providing an electrical signal which is proportional to the distance of the top surface of the susceptor assembly to the capacitance sensor; and
 a controller connected to the plurality of capacitance sensors to determine the gap between the top surface of the susceptor assembly and the front surface of the gas distribution assembly from the electrical signals provided by the plurality of capacitance sensors.
11. The apparatus of embodiment 10, wherein the controller includes a memory to store calibrated values of the electrical signals provided by the plurality of capacitance sensors as a function of the gap as one or more of a lookup table or standardization equation.
12. The apparatus of embodiment 10 or 11, wherein the controller determines the gap between the top surface of the susceptor assembly and the front surface of the gas distribution assembly at each capacitance sensor position while the susceptor assembly remains stationary.
13. The apparatus of embodiment 12, wherein the controller creates a three-dimensional map of the top surface of the susceptor assembly from the electrical signals provided by the plurality of capacitance sensors.
14. The apparatus of embodiment 10 to 13, wherein the controller uses a plurality of measurements from at least one capacitance sensor taken during a processing cycle in which the susceptor assembly rotates, the controller determining the planarity of a portion of the susceptor assembly adjacent the capacitance sensor from the electrical signals provided by the capacitance sensor during the processing cycle.
15. The apparatus of embodiment 10 to 14, wherein the controller includes a feedback circuit in communication with at least one gap control actuation device, the controller providing a signal to the at least one gap control actuation device to direct the device to move one or more of the susceptor assembly and the gas distribution assembly to change the gap.
16. Embodiment 16 is directed to a deposition apparatus comprising:
 a susceptor assembly to rotate a plurality of substrates around a central axis, the susceptor assembly having a top surface and a bottom surface, the top surface having a plurality of recesses to hold a plurality of substrates, each recess having a center, the bottom surface having an alignment reference point for each of the plurality of recesses, each alignment reference point opposite a recess;
 a camera with a field of view directed at the bottom surface of the susceptor assembly and positioned so that when a recess is positioned adjacent a loading station, the alignment reference point opposite the recess is within the field of view of the camera; and
 a controller connected to the camera to determine the position of the recess adjacent the loading station from the alignment reference point.
17. The apparatus of embodiment 16, wherein the alignment reference point comprises a recess center reference point and a camera reference point, the recess center reference point providing an indication of the position of the center of the recess and the camera reference point providing an indication of the camera alignment relative to the recess center reference point to correct for marking misalignment.
18. The apparatus of embodiment 17, wherein the recess center reference point comprises a hole in the bottom surface of the susceptor assembly.
19. The apparatus of embodiment 17, wherein the camera reference point comprises a shape made up of at two vertices having known distances between each vertex.
20. The apparatus of embodiment 19, wherein the camera reference point comprises a rectangular shape.
21. The apparatus of embodiment 16 to 20, wherein the controller includes a memory to store calibrated values of each alignment reference point, the controller determining the position of the recess by comparing the alignment reference point to the stored calibrated values.
22. The apparatus of embodiment 21, wherein the controller is in communication with the susceptor assembly to send signals to rotate the susceptor assembly based on the determination of the position of the recess.
23. The apparatus of embodiment 21, wherein the controller is in communication with a transfer robot to provide a signal to the robot indicating the location of the recess so that the robot can place a substrate in the recess in a consistent position.
24. The apparatus of embodiment 16 to 23, wherein the bottom surface of the susceptor assembly further comprises a temperature reference point within the field of view of the camera and the determines the temperature of the susceptor assembly from the position of the temperature reference point.
25. The apparatus of embodiment 24, wherein the temperature reference point comprises a groove in the bottom surface of the susceptor assembly at a fixed diameter.
26. The apparatus of embodiment 24, wherein the temperature reference point and the alignment reference point are within the field of view at the same time and the controller determines the position of the recess compensating for the temperature of the susceptor assembly.
27. Embodiment 27 is directed to a method of measuring a gap between a rotatable susceptor assembly and a gas distribution assembly in a processing chamber, the method comprising:
 positioning at least one camera adjacent the susceptor assembly and gas distribution assembly so that an edge of the susceptor assembly, and optionally, an edge of the gas distribution assembly and the gap are visible in a field of view of the camera;
taking an image of the field of view of the camera, the image including the edge of the susceptor assembly and, optionally, the edge of the gas distribution assembly and the gap;
determining the position on the image of a top surface of the susceptor assembly and, optionally, a front surface of the gas distribution assembly; and
measuring the gap between the top surface of the susceptor assembly and the front surface of the gas distribution assembly from the image.

28. The method of embodiment 27, wherein there are three cameras positioned around the susceptor assembly and gas distribution assembly and the gap is measured for each camera.

29. The method of embodiment 28, further comprising determining an angle of tilt of the susceptor assembly relative to the gas distribution plate.

30. The method of embodiment 27, wherein measuring the gap comprises one or more of measuring the distance between the top surface of the susceptor assembly and the front surface of the gas distribution assembly or measuring the distance between the top surface of the susceptor assembly and a reference plane.

31. The method of embodiment 27, wherein a single camera is used and the method further comprising:
rotating the susceptor assembly about a central axis;
taking in image of the field of view of the camera at known rotational angles relative to the susceptor assembly to generate a plurality of images;
determining the gap for each of the plurality of images; and
determining the uniformity of the gap as a function of the susceptor assembly rotational angle.

32. Embodiment 32 is directed to a method of measuring a gap between a rotatable susceptor assembly and a gas distribution assembly in a processing chamber, the method comprising:
positioning at least one sensor on the gas distribution assembly facing the susceptor assembly, the sensor being one or more of a capacitance sensor or eddy current sensor;
measuring an electrical signal from the at least one sensor, the electrical signal being proportional to the gap between the susceptor assembly and the sensor; and
determining the gap between the susceptor assembly and the gas distribution assembly from the electrical signal.

33. The method of embodiment 32, wherein a plurality of sensors are positioned on the gas distribution assembly, and the electrical signal from each sensor is measured, and the method further comprising determining the gap between the susceptor assembly and each sensor, and generating the three-dimensional map of the susceptor assembly.

34. The method of embodiment 32, wherein a single capacitance susceptor is monitored, the method further comprising:
rotating the susceptor assembly about a central axis;
measuring a plurality of electrical signals from the capacitance susceptor as a function of susceptor assembly rotational angle or time;
determining the gap for each of the plurality of electrical signals; and
determining the uniformity of the gap as a function of the susceptor assembly rotational angle or time.

35. Embodiment 35 is directed to a method of transferring a substrate to a rotatable susceptor assembly, the method comprising:
rotating the susceptor assembly so that a recess in a top surface of the susceptor assembly is positioned adjacent a loading area of a processing chamber;
finding an alignment reference point on a back side of the susceptor assembly using a camera directed at the back side of the susceptor assembly;
evaluating the position of the recess on the top surface of the susceptor assembly by measuring the position of the alignment reference point on the back side of the susceptor assembly to determine coordinates of the recess; and
communicating the coordinates of the recess to one or more of a controller and a transfer robot to allow the transfer robot to place the substrate within the recess reproducibly.

36. The method of embodiment 35, wherein the alignment reference point comprises a recess center reference point and a camera reference point, the recess center reference point providing an indication of the position of the center of the recess and the camera reference point providing an indication of the camera alignment relative to the camera reference point, evaluating the position of the recess further comprising correcting for the alignment of the camera.

37. The method of embodiment 35, wherein the controller includes a memory to store calibrated values of each alignment reference point, the controller determining the position of the recess by comparing the alignment reference point to the stored calibrated values and adjusting the rotational position of the susceptor assembly to improve the alignment of the recess with the loading area.

38. The method of embodiment 35, further comprising:
finding a temperature reference point on the bottom of the susceptor using a camera;
measuring a temperature of the susceptor assembly from a position of the temperature reference point.

39. The method of embodiment 38, wherein the temperature reference point comprises a groove in the bottom surface of the susceptor assembly at a fixed diameter.

40. The method of embodiment 38, wherein the temperature reference point and the alignment reference point are within a field of view of the camera at the same time and the coordinates of the recess are determined compensating for the temperature of the susceptor assembly.

41. The method of embodiment 38, wherein the temperature reference point is the alignment reference point.

While the foregoing is directed to embodiments of the present invention, other and further embodiments of the invention may be devised without departing from the basic scope thereof, and the scope thereof is determined by the claims that follow.

What is claimed is:
1. A deposition apparatus comprising:
a gas distribution assembly having a front surface;
a susceptor assembly to rotate a plurality of substrates around a central axis and move closer to and further from the gas distribution assembly, the susceptor assembly having a top surface facing the front surface of the gas distribution assembly and a bottom surface, the region between the top surface of the susceptor assembly and the front surface of the gas distribution assembly defining a gap, the top surface having a plurality of recesses to hold a plurality of substrates, each recess having a center, the bottom surface having an alignment reference point opposite each of the plurality of recesses and a temperature reference point comprising a groove at a fixed diameter, the alignment reference point comprising a recess center reference point and a camera reference point, the camera reference point having a shape involving at least two vertices having a known distance, the recess center reference point providing an indication of the position of the center of the recess;

a camera with a field of view directed at the bottom surface of the susceptor assembly and positioned so that when one of the plurality of recesses is positioned adjacent a loading station, the alignment reference point opposite the recess and the temperature reference point are within the field of view of the camera; and a controller connected to the camera to determine a position of the recess adjacent the loading station from the alignment reference point and a temperature of the susceptor assembly from the position of the temperature reference point, the controller configured to measure a distance between the at least two vertices to determine one or more of a distance of the camera from the susceptor assembly or a distance between the front surface of the gas distribution assembly and the top surface of the susceptor assembly and configured to adjust the gap.

2. The apparatus of claim 1, wherein the camera reference point provides an indication of the camera alignment relative to the recess center reference point to correct for marking misalignment.

3. The apparatus of claim 2, wherein the recess center reference point comprises a shallow hole in the bottom surface of the susceptor assembly.

4. The apparatus of claim 2, wherein the camera reference point comprises a shape made up of at least three vertices having known distances between each vertex.

5. The apparatus of claim 4, wherein the camera reference point comprises a rectangular shape.

6. The apparatus of claim 1, wherein the controller includes a memory to store calibrated values of each alignment reference point, the controller determining the position of the recess by comparing the alignment reference point to the stored calibrated values.

7. The apparatus of claim 6, wherein the controller is in communication with the susceptor assembly to send signals to rotate the susceptor assembly based on the determination of the position of the recess.

8. The apparatus of claim 6, wherein the controller is in communication with a transfer robot to provide a signal to the robot indicating a location of the recess so that the robot can place a substrate in the recess in a consistent position.

9. The apparatus of claim 1, wherein the temperature reference point and the alignment reference point are within the field of view at the same time and the controller determines the position of the recess compensating for the temperature of the susceptor assembly.

10. The apparatus of claim 1, wherein the controller further comprises a feedback circuit in communication with at least one gap control actuation device, the controller providing a signal to the at least one gap control actuation device to direct the device to move one or more of the susceptor assembly and the gas distribution assembly to change the gap.

11. The apparatus of claim 10, wherein the gap control actuation device comprises one or more actuator.

12. The apparatus of claim 10, wherein the gap control actuation device comprises a support post.

13. A deposition apparatus comprising:

a gas distribution assembly having a front surface;

a susceptor assembly to rotate a plurality of substrates around a central axis, the susceptor assembly having a top surface facing the front surface and a bottom surface, the region between the top surface and the front surface defining a gap, the top surface having a plurality of recesses to hold the plurality of substrates, each recess having a center, the bottom surface having an alignment reference point opposite each of the plurality of recesses and a temperature reference point comprising a groove at a fixed diameter, the alignment reference point comprising a recess center reference point and a camera reference point, the camera reference point having a shape involving at least two vertices having a known distance, the recess center reference point providing an indication of the position of the center of the recess;

a gap control actuation device connected to the susceptor assembly and configured to adjust the gap by moving the susceptor assembly;

a camera with a field of view directed at the bottom surface of the susceptor assembly and positioned so that when one of the plurality of recesses is positioned adjacent a loading station, the alignment reference point opposite the recess and the temperature reference point are within the field of view of the camera; and a controller connected to the camera and the gap control actuation device, the controller configured to determine a position of the recess adjacent the loading station from the alignment reference point and to determine a temperature of the susceptor assembly from the position of the temperature reference point, the controller configured to measure a distance between the at least two vertices to determine one or more of a distance of the camera from the susceptor assembly or the gap, the controller configured to control the gap control actuation device to adjust the gap.

14. A method of transferring a substrate to a rotatable susceptor assembly, the method comprising:

rotating the susceptor assembly around a central axis so that one of a plurality of recesses in a top surface of the susceptor assembly is positioned adjacent a loading area of a processing chamber, each recess having a center;

moving the susceptor assembly closer to and further from a gas distribution assembly, the top surface of the susceptor assembly facing a front surface of the gas distribution assembly, the region between the top surface of the susceptor assembly and the front surface of the gas distribution assembly defining a gap;

finding an alignment reference point on a bottom surface of the susceptor assembly opposite the recess in the top surface using a camera with a field of view directed at the bottom surface of the susceptor assembly, the alignment reference point comprising a recess center reference point and a camera reference point, the recess center reference point providing an indication of the position of the center of the recess, the camera reference point having a shape including at least two vertices having a known distance;

finding a temperature reference point on the bottom surface of the susceptor assembly using the camera with a field of view directed at the bottom surface of the susceptor assembly, the temperature reference point comprising a groove at a fixed diameter;

evaluating a position of the recess on the top surface of the susceptor assembly by measuring a position of the alignment reference point on the bottom surface of the susceptor assembly to determine coordinates of the recess;

evaluating a temperature of the susceptor assembly by measuring a position of the temperature reference point on the bottom surface of the susceptor assembly to determine the temperature of the susceptor assembly;

evaluating one or more of a distance of the camera from the susceptor assembly or a distance between the front surface of the gas distribution assembly and the top surface of the susceptor assembly by measuring the distance between the at least two vertices;

communicating the coordinates of the recess to one or more of a controller to rotate the susceptor assembly or a transfer robot to allow the transfer robot to place the substrate within the recess reproducibly; and communicating one or more of the distance of the camera from the susceptor assembly or the distance between the front surface of the gas distribution assembly and the top surface of the susceptor assembly to a controller to adjust the gap.

15. The method of claim 14, wherein the camera reference point provides an indication of the camera alignment relative to the camera reference point, and further comprising:

evaluating the position of the recess; and correcting for marking misalignment.

16. The method of claim 14, wherein the controller includes a memory to store calibrated values of each alignment reference point, the controller determining the position of the recess by comparing the alignment reference point to the stored calibrated values and adjusting a rotational position of the susceptor assembly to improve the alignment of the recess with the loading area.

17. The method of claim 14, wherein the temperature reference point and the alignment reference point are within a field of view of the camera at the same time and the coordinates of the recess are determined compensating for the temperature of the susceptor assembly.

18. The method of claim 14, wherein the temperature reference point is the alignment reference point.

* * * * *